United States Patent
Watanabe et al.

(10) Patent No.: US 6,490,026 B1
(45) Date of Patent: Dec. 3, 2002

(54) METHOD AND SYSTEM FOR ALIGNING OBJECT TO BE PROCESSED WITH PREDETERMINED TARGET ARTICLE

(75) Inventors: Akira Watanabe, Tokyo (JP); Akihiko Nara, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 117 days.

(21) Appl. No.: 09/589,125

(22) Filed: Jun. 8, 2000

(30) Foreign Application Priority Data

Aug. 20, 1999 (JP) ............................. 11-233708

(51) Int. Cl.[7] ................. G03B 27/42; G03B 27/58; G03B 27/32; G01B 11/00; G03C 5/00
(52) U.S. Cl. ..................... 355/53; 355/72; 355/77; 356/401; 430/30
(58) Field of Search ..................... 355/53, 72, 75, 355/77; 356/358, 399, 400, 401; 430/22, 30

(56) References Cited

U.S. PATENT DOCUMENTS

| | | | |
|---|---|---|---|
| 4,345,836 A | 8/1982 | Phillips | |
| 5,227,838 A | 7/1993 | Nakanishi et al. | |
| 5,238,354 A | * 8/1993 | Volovich | 356/400 |
| 5,737,441 A | * 4/1998 | Nishi | 356/401 |
| 6,020,964 A | * 2/2000 | Loopstra et al. | 356/401 |
| 6,184,972 B1 | * 2/2001 | Mizutani et al. | 355/72 |
| 6,225,012 B1 | * 5/2001 | Nishi et al. | 430/22 |

* cited by examiner

Primary Examiner—Russell Adams
Assistant Examiner—Peter B Kim
(74) Attorney, Agent, or Firm—Rabin & Berdo, P.C.

(57) ABSTRACT

A method and a system are disclosed for aligning an object to be processed with a predetermined target article, with enhanced accuracy. The method includes the steps of detecting positional data with respect to the object in a state such that the object is rotated by +90 degrees with respect to a reference direction (step S104), and also detecting positional data with respect to the object in a state such that the object is rotated by −90 degrees with respect to the reference direction (step S108). A positional correction factor for the object's position can then be calculated by making use of the positional data attained by both of the above detection steps (step S109). Therefore, asymmetrical signal waveforms when the reflected alignment light is detected can be offset, so that the alignment accuracy can be enhanced.

25 Claims, 8 Drawing Sheets

METHOD AND SYSTEM FOR ALIGNING OBJECT TO BE PROCESSED WITH PREDETERMINED TARGET ARTICLE

BACKGROUND OF THE INVENTION

1. Field of the Invention

The present invention relates to a method for aligning an object to be processed with a predetermined target article and a system for carrying out the same.

It is well known that a stepping projection aligner (a so-called "stepper") has been used in general for carrying out the photolithography treatment of a semiconductor wafer (simply called a "wafer" hereinafter) in the manufacturing process of semiconductor devices. In the photolithography treatment of the wafer by using such a stepper, the most important point is to align the wafer mounted on a stage (called a stage chuck or a reticle stage) with a reticle pattern which has been set up in advance in a predetermined position of the stepper.

2. Prior Art

The prior art process for aligning the wafer with a target article has been carried out in general in the following manner.

The wafer conveyed to the stepper is first preliminarily positioned by using a pre-aligner of the stepper such that the direction of the wafer, more particularly, the direction of a alignment mark pattern formed in advance on the wafer surface, coincides with the direction of the reticle pattern. The wafer preliminarily positioned by the pre-aligner is further conveyed to a stage and is then finally aligned with the reticle pattern by means of an alignment optical system. As described above, the wafer includes a plurality of alignment marks formed in advance on the surface of the wafer for the purpose of alignment, and the alignment by the alignment optical system is carried out by detecting the waveform of an alignment light reflected by the alignment marks, which are irradiated by the alignment light (laser rays). After detecting the waveforms of the reflected alignment light with respect to all the alignment marks, a positional correction factor with respect to the wafer position is calculated, based on the detection of the reflected waveforms. The stage carrying the wafer is then moved in the necessary direction to correct the wafer position based on the result of the above calculation on the positional correction factor, and finally, the exposure of the wafer to the reticle pattern light is carried out to copy the reticle pattern thereto.

However, the method for aligning the wafer with the reticle pattern as described above has some problems, especially a reduction in the accuracy of the alignment that is achieved. This alignment accuracy reduction is mainly caused by the following reasons. The first reason relates to an incomplete optical adjustment, which may cause a certain difference between the optical path of the incident alignment light and that of the reflected one. The second relates to the use of laser rays as the alignment light. In this case, if the optical path of the incident laser rays coincides with that of the reflected one, interference may be caused there between. In order to avoid this, some type of optical adjustment is required with respect to the optical paths of the incident and reflected alignment light rays, for instance, making a certain angle between the incident alignment light entering the alignment optical system and the reflected one coming out therefrom. The third reason relates to an incomplete positional adjustment between parts constituting the alignment optical system. Due to such reasons as described above, some deformation might be caused in the waveform of the reflected alignment light, thereby causing a reduction in the accuracy of the alignment.

SUMMARY OF THE INVENTION

The present invention has been made in view of various problems as described above in connection with the prior art method for aligning the object to be processed, and its object is to provide a novel and improved method and system for aligning the object to be processed, having a much enhanced alignment accuracy comparing with the prior art method and system.

In order to solve the problems as described above, according to the present invention, there is provided a method for aligning an object to be processed with a predetermined target article. This method is executed by a system which includes a pre-aligner for positioning the object before conveying it into a processing area, and a stage for supporting the object from the underside thereof, and is characterized by the following processes, that is, the first process for conveying the object to the pre-aligner to mount it thereon, operating the pre-aligner to rotate the object about the center thereof by +90 degrees with respect to the reference direction, and positioning the object in such rotated state; the second process for conveying said object to the stage to mount it thereon and detecting the positional data with respect to the object in such rotated state; the third process for again conveying the object to the pre-aligner to mount it thereon, operating the pre-aligner to rotate the object by −90 degrees with respect to the reference direction, and positioning the object in such a rotated state; the fourth process for again conveying said object to the stage to mount it thereon and detecting the positional data with respect to the object in such a rotated state; the fifth process for calculating the positional correction factor for the object position by making use of the detection results attained through the second and fourth processes; and the sixth process for finally conveying the object to the pre-aligner to mount it thereon, and operating the pre-aligner to rotate the object to direct it to the reference direction.

According to the present invention, there is provided another method for aligning an object to be processed with a predetermined target article. This method is executed by a system which also includes a pre-aligner for positioning the object before conveying it into a processing area, and a stage for supporting the object from the underside thereof, and is characterized by the following processes, that is, the first process for conveying the object to the pre-aligner to mount it thereon, operating the pre-aligner to rotate the object about the center thereof by 180 degrees with respect to the reference direction, and positioning the object in such a rotated state; the second process for conveying said object to the stage to mount it thereon and detecting the positional data with respect to the object in such rotated state; the third process for again conveying the object to the pre-aligner to mount it thereon, operating the pre-aligner to rotate the object to direct it to the reference direction, and positioning the object in such rotated state; the fourth process for again conveying the object to the stage to mount it thereon and detecting the positional data with respect to the object directed to the reference direction; and the fifth process for calculating the positional correction factor for the object position by making use of the detection results attained through the second and fourth processes.

Furthermore, according to the present invention, there is provided still another method for aligning an object to be processed with a predetermined target article. This method is executed by a system which also includes a pre-aligner for positioning the object before conveying it into a processing area, and a stage for supporting the object from the underside thereof, and is characterized by the following processes, that is, the first process for conveying the object to the pre-aligner to mount it thereon, operating the pre-aligner to rotate the object by +90 degrees with respect to the reference direction, and positioning the object in such a rotated state; the second process for conveying the object to the stage to mount it thereon and detecting the positional data with respect to the object in such rotated state; the third process for operating the stage to rotate the object mounted thereon by −180 degrees and then detecting the positional data of the object in such a state that the object is substantially rotated by−90 degrees with respect to the reference direction; the fourth process for calculating the positional correction factor for the object position by making use of the detection results attained through the second and third processes; and the fifth process for again rotating the stage by +90 degrees to direct the object to the reference direction.

Still further, according to the present invention, there is provided still another method for aligning an object to be processed with a predetermined target article. This method is executed by a system which also includes a pre-aligner for positioning the object before conveying it into a processing area, and a stage for supporting the object from the underside thereof, and is characterized by the following processes, that is, the first process for conveying the object to the pre-aligner to mount it thereon, operating the pre-aligner to rotate the object by +180 degrees with respect to the reference direction, and positioning the object in such a rotated state; the second process for conveying said object to the stage to mount it thereon and then detecting the positional data with respect to the object in such rotated state; the third process for operating the stage to rotate the object mounted thereon by −180 degrees and then detecting the positional data of the object in such a state that the object is substantially directed to the reference direction; and the fourth process for calculating the positional correction factor for the object position by making use of the detection results attained through the second and third processes.

Furthermore, in order to solve the problems as described above, according to the present invention, there is provided a system for aligning an object to be processed with a predetermined target article. This system includes a pre-aligner for positioning the object before conveying it into a processing area; and a stage for supporting the object from the thereof, wherein the pre-aligner and/or the stage includes a rotation mechanism capable of rotating object.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The method and system for aligning an object to be processed with a predetermined target article according to the invention will now be described by way of certain preferred embodiments thereof with reference to the accompanying drawings. In the following description, the above method and system are applied to the step of exposing the object to a reticle pattern light during various semiconductor manufacturing processes, but it should be noted that the invention is not limited by this. In the specification and drawings of this application, parts having substantially the same function and configuration in each of the several figures are designated by the same reference numeral or character in order to avoid a redundant, repetitive description.

To start with, steppers (stepping projection aligners) which can be used with each of embodiments according to the invention will be described, with reference to FIGS. 1 and 2.

Figure 1:
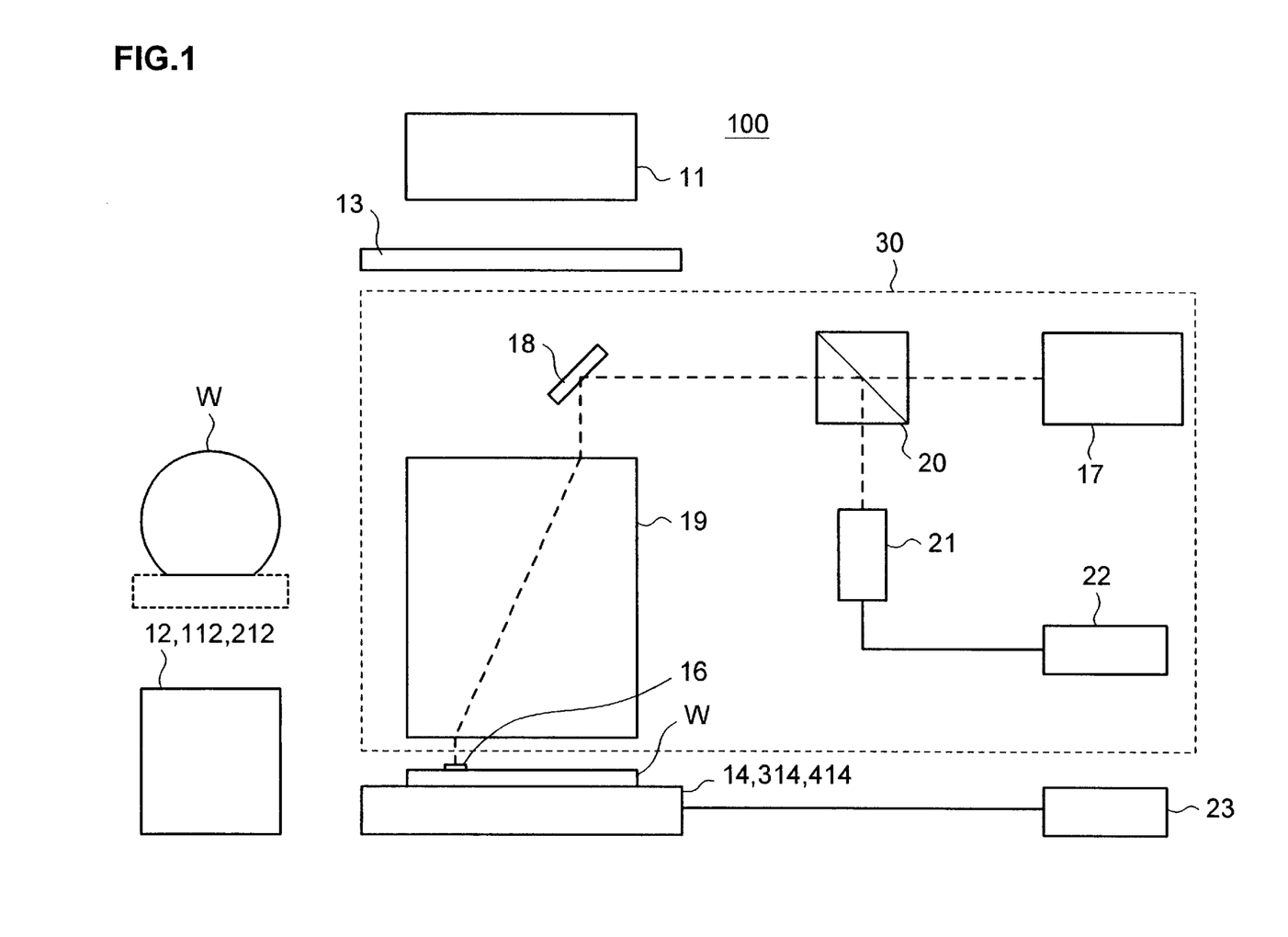
FIG. 1 is a block diagram for explaining a stepper adopting the Through-The-Lens (LTT) system.

Referring to FIG. 1, a stepper 100 includes a projection aligner 11, a pre-aligner 12 (112, 212) for preliminarily positioning a wafer W before conveying it into a processing area, a reticle pattern 13, a stage 14 (314, 414) for supporting the wafer W mounted thereon from the underside of it while the wafer is exposed to the reticle pattern light, and an alignment optical system 30 for carrying out the positional detection of the wafer W mounted on the stage 14. In what follows, the object that is to be aligned is the wafer W, and the target article with which it is to be aligned is the reticle pattern 13.

The alignment optical system 30 as shown in FIG. 1 is constituted such that it is suitable for making use of an alignment system called the Through-The-Lens (TTL) System, which will be described in the following.

Alignment light is emitted from an alignment light source 17 and irradiates alignment marks 16, which are provided in advance on the surface of the wafer W, through a deflection mirror 18 as well as a reduction projection lens 19. In the TTL system, laser rays are used as the alignment light in general.

The alignment light reflected by the alignment mark 16 takes the same optical path as the incident alignment light, and travels to a beam splitter 20 that is arranged between the alignment light source 17 and the deflection mirror 18. The reflected alignment light is then diverted to another optical path by the beam splitter 20 and is received by an alignment waveform detector 21. The received alignment waveform is processed by an alignment signal processor 22, thereby obtaining the center position between the irradiated alignment marks.

The position of the stage 14 of this time is measured by a stage position detection system 23. That is, when the stage 14 is moved to the alignment detection position, the position of the stage 14 is measured there, and this stage position as measured is additionally processed together with the position of the alignment mark as calculated, thereby positioning the wafer W.

Figure 2:
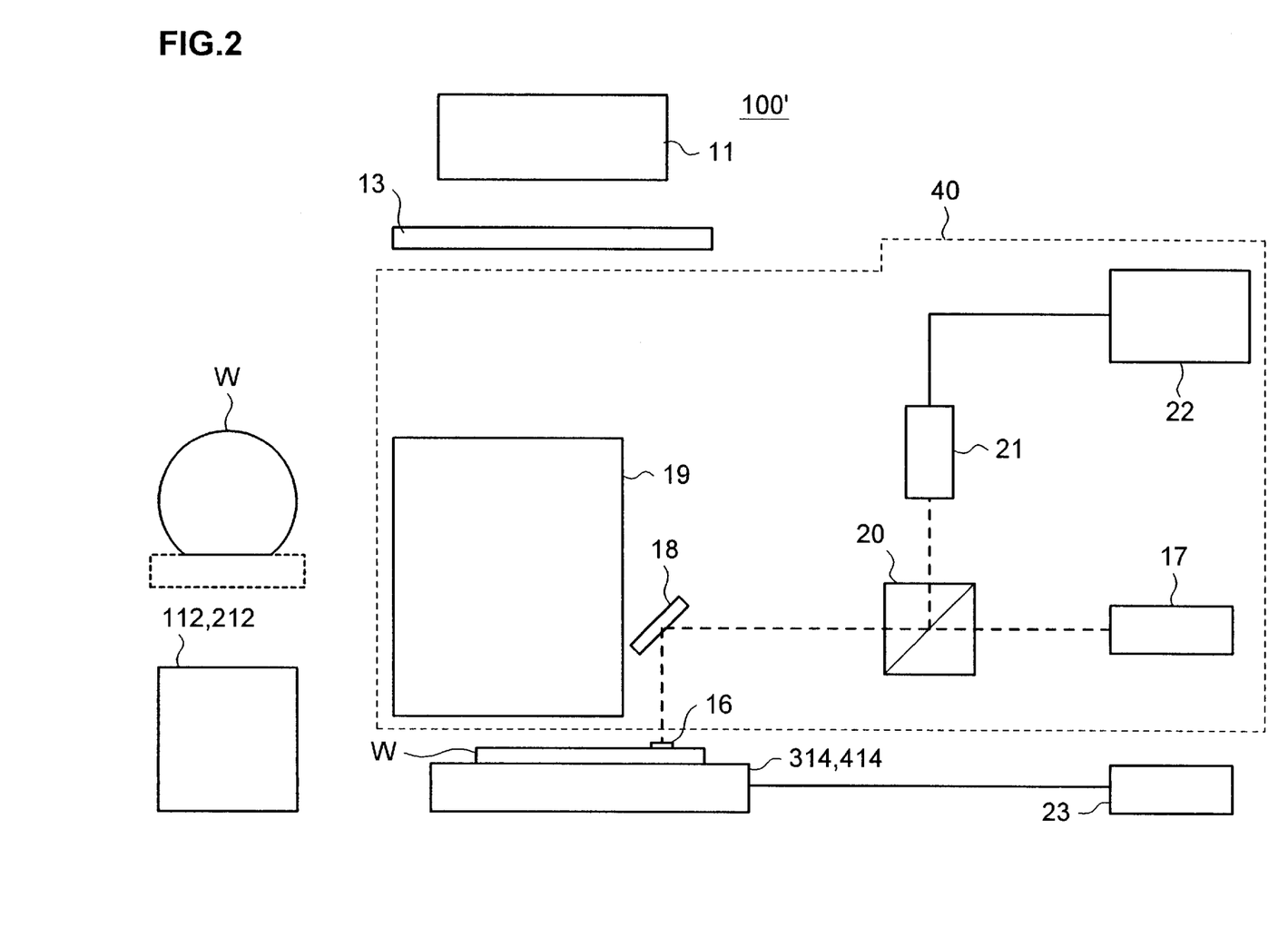
FIG. 2 is a block diagram for explaining a stepper adopting the Off-axis system.

The stepper 100' as shown in FIG. 2 has a structure which is achieved by substituting an alignment optical system 40 for the alignment optical system 30 of the stepper 100. This alignment optical system 40 is constituted so as to be suitable for making use of an Off-axis system. This system differs from the TTL system in that the alignment light deflected by the deflection mirror 18 directly irradiates the alignment mark 16 without passing through the reduction projection lens 19. These two systems also differ from each other with respect to the alignment light, that is, the Off-axis system makes use of the visible light while the TTL system does laser rays.

A method and system for aligning the object to be processed with the reticle pattern, which method and system use the above-mentioned stepper 100 (or stepper 100'), will now be described in detail with reference to FIG. 3 through FIG. 8.

In the following several preferred embodiments according to the invention, in order to prepare for the final alignment between the wafer and the target reticle pattern, a wafer conveyed to and mounted on the pre-aligner and/or the stage is given a certain movement such as an angular movement or a linear movement (X-Y directions) within a plane for supporting the wafer of the pre-aligner and/or the stage. Therefore, it is needed to define a reference direction with respect to such movements for better understanding of the following description. Accordingly, a reference direction is here defined as a direction to which the alignment mark pattern on the wafer is directed when the wafer is initially mounted on the pre-aligner and/or the stage.

First Embodiment

The pre-aligner 112 used in this embodiment is provided with a rotation mechanism capable of rotating the wafer W mounted thereon by a predetermined angle with respect to the reference direction. With the help of this rotation mechanism, therefore, the position of the wafer W can be determined corresponding to its rotated state, for instance, corresponding to the state of the wafer as rotated by +90 degrees and −90 degrees with respect to the reference direction, respectively. In this specification, the expressions "+n degrees" and "−n degrees" indicate rotations that are identical to each other in terms of the rotational angle but different from each other in terms of the rotational direction.

Figure 3:
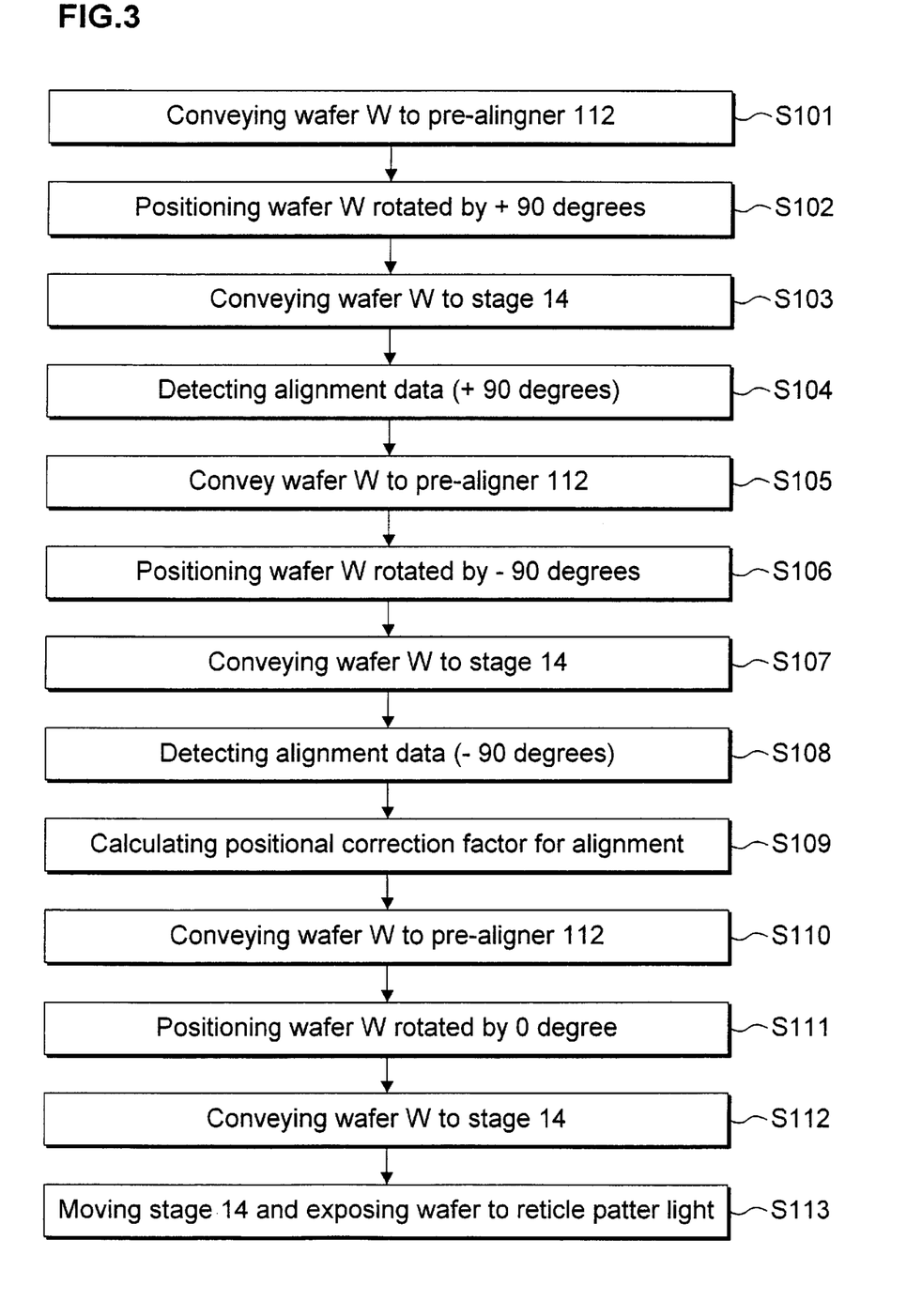
FIG. 3 is a flowchart for explaining an alignment method according the first embodiment of the invention.

The method for aligning the wafer with the reticle pattern according to the first embodiment will now be described with reference to the flowchart of FIG. 3. In the first place, the wafer W is conveyed to and mounted on the pre-aligner 112 (step S101). With the subsequent operation of its rotation mechanism, the wafer W is rotated by +90 degrees with respect to the reference direction (step S102). Initial positioning of the wafer W can be carried out referring to an orientation flat or a notch formed in the wafer W.

Figure 4:
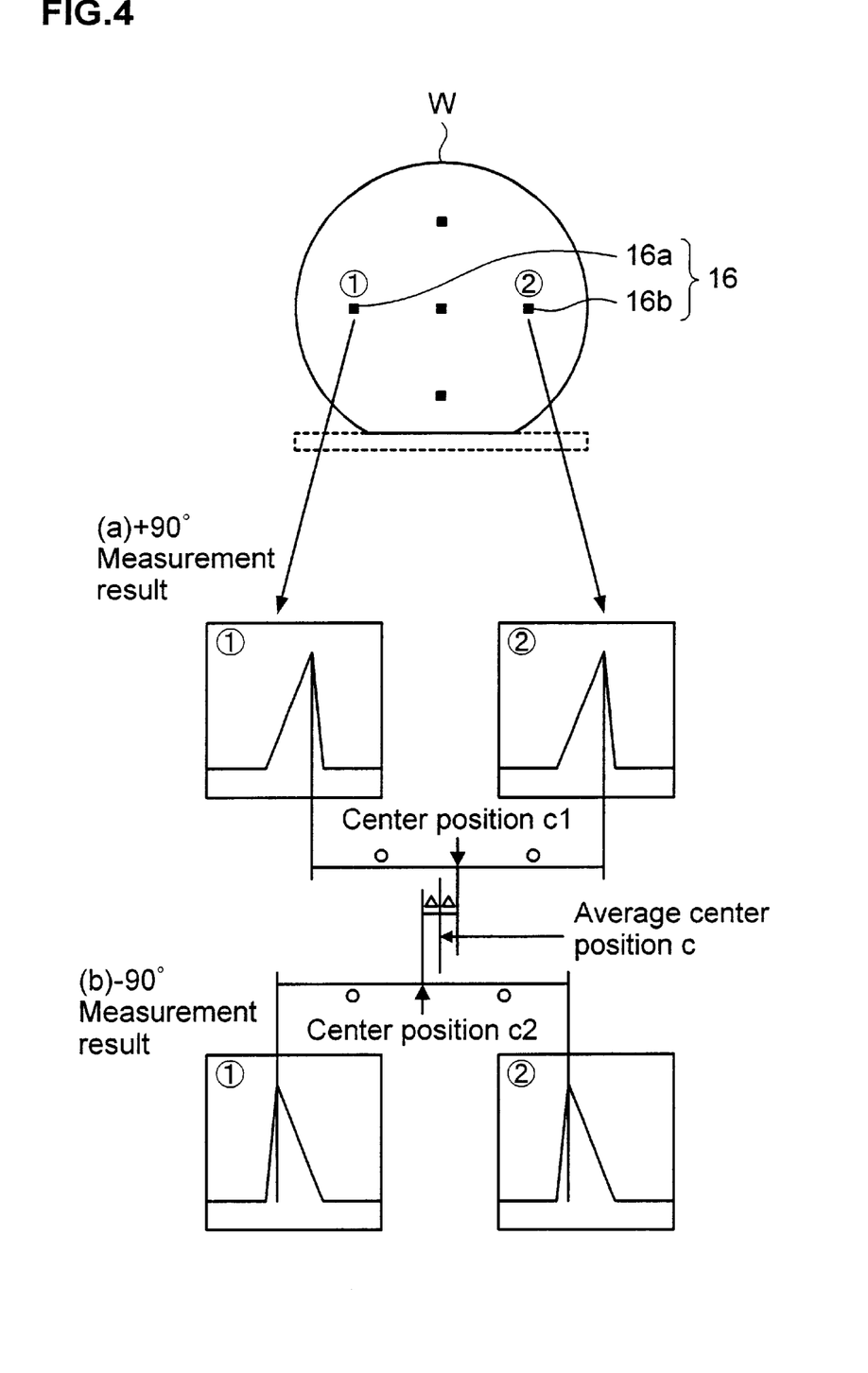
FIG. 4 is a diagram for explaining how to calculate the positional correction factor for the wafer position.

Then, the wafer W is conveyed to and mounted on the stage 14 (step S103), where the positional detection is carried out with respect to each of a plurality of alignment marks (step S104). In this embodiment, the positional detection is performed with regard to two alignment marks 16a and 16b as shown in FIG. 4. The positional detection may be performed by making use of either the TTL system or the Off-axis system, both of which have previously been described. The positional data obtained from these alignment marks on the +90 degrees rotated wafer W are temporarily stored in a memory.

After completing the detection of positional data on the alignment marks of the +90 degrees rotated wafer W, the wafer W is again conveyed to and mounted on the pre-aligner 112 (step S105). With the subsequent operation of its rotation mechanism, the wafer W is rotated by −90 degrees with respect to the reference direction (step S106). Then, the wafer W is again conveyed to and mounted on the stage 14 (step S107), where the positional detection is again carried out with respect to alignment marks 16a and 16b (step S108). The positional data obtained from these alignment marks of the −90 degrees rotated wafer W are temporarily stored in the memory.

Next, the positional correction factor for the wafer W is calculated by making use of the positional data which are obtained from the alignment marks of the +90 degrees rotated wafer and the −90 degrees rotated wafer as well (step S109).

Here, how the positional correction factor for the wafer W is calculated in the step S109 will be described with reference to FIG. 4. In each of four graphs including a detected signal waveform shown in FIG. 4, its abscissa represents the detected position while its ordinate indicates the quantity of the laser rays as detected. Based on the positional data obtained when rotating the wafer W by +90 degrees with respect to the reference direction, there is calculated a center position c1 between the peak of the signal waveform for the alignment mark 16a (FIG. 4(a), (1) and the same for the alignment mark 16b (FIG. 4(a), (2). In the same manner, based on the positional data obtained when rotating the wafer W by −90 degrees with respect to the reference direction, there is calculated a center position c2 between the peak of the signal waveform for the alignment mark 16a (FIG. 4(b), (1)) and the same for the alignment mark 16b (FIG. 4(b), (2)).

Then, an average center position c is calculated based on two center positions c1 and c2 which are calculated by using two positional data as described above. Alignment between the wafer W and the reticle pattern 13 is carried out by using this calculated average center position c. As will be readily understood, the use of this average center position c can produce a very advantageous result. That is, the differences in the asymmetry (inclination) of the signal waveforms, which might be likely to be caused by every rotation (e.g. +90 degrees or −90 degrees) of the wafer W, can be offset, thus making it possible to eliminate such differences in the measurement result as are caused depending on the optical system.

The wafer W is again conveyed to and mounted on the pre-aligner 112 (step S110), and the wafer W is returned to be in the state before being rotated (0 degree rotation) i.e. to be directed to the reference direction (step S111). Then, the wafer W is again conveyed to and mounted on the stage 14 (step S112), where the final alignment between the wafer and the reticle pattern is performed by moving the stage 14 in the necessary directions (X and/or Y) and then, the exposure of the wafer W to the reticle pattern light is carried out to copy the reticle pattern to the wafer W (step S113).

Figure 5:
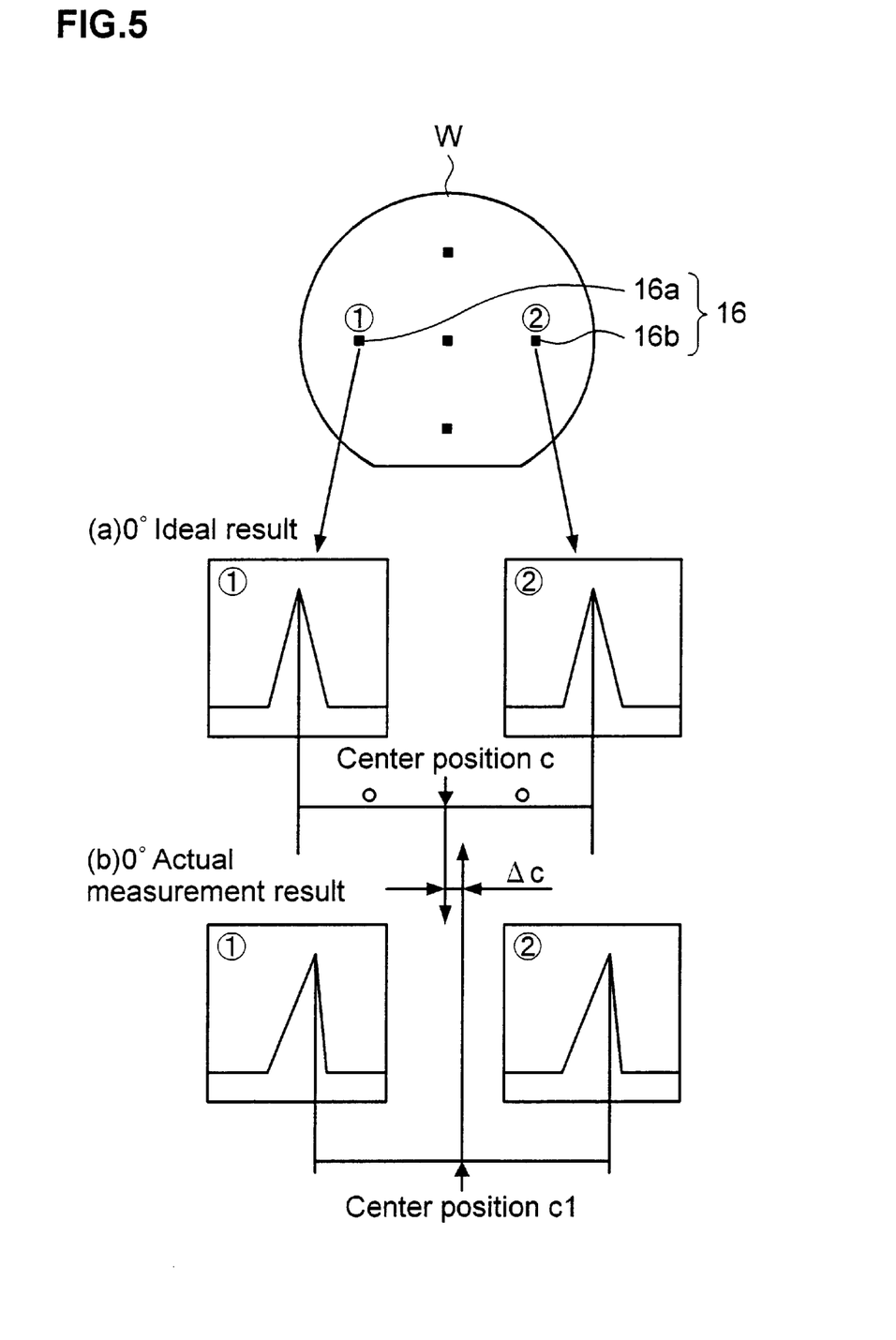
FIG. 5 is a diagram for explaining a comparative example with regard to the first embodiment of the invention.

Here, referring to FIG. 5, let us compare the way of calculating the positional correction factor for the wafer W according to the first embodiment as described above, with another example of calculating the same in which no rotation of the wafer W is carried out, that is, the wafer keeps staying in the reference direction. FIG. 5(a) shows signal waveforms (1) and (2) which are ideally obtained by detecting the positions of alignment marks 16a and 16b. In actual practice, however, the signal waveforms can not help being generally deformed to some extent as shown in FIG. 5(b). Consequently, there is naturally generated a certain difference Δc between the center position c of the peak-to-peak distance of two ideal signal waveforms and the center position c1 of the peak-to-peak distance of two actual signal waveforms.

As previously described, such difference is mainly caused by the following reasons. The first reason is incomplete optical adjustment, which may cause a certain difference between the optical path of the incident alignment light and that of the reflected light. The second relates to use of laser rays as the alignment light. In this case, if the optical path of the incident laser rays coincides with that of the reflected rays, interference may be caused there between. In order to avoid this, there is required some optical adjustment with respect to the optical paths of the incident and reflected alignment light rays, for instance making a certain angle between the incident alignment light entering the alignment optical system and the reflected one coming out therefrom. The third reason relates to incomplete positional adjustment between parts constituting the alignment optical system.

As will be apparent from the above example as described for comparison purpose, according to the first embodiment of the invention, the positional correction factor for the wafer W is calculated based on the positional data obtained from the alignment marks of the +90 degrees rotated wafer and the same of the −90 degrees rotated wafer. Therefore, the calculation result can be free from the deformation of the signal waveform, thus enabling the alignment accuracy of the wafer and the reticle pattern to be enhanced.

Second Embodiment

A pre-aligner 212 used in this embodiment is provided with a rotation mechanism capable of rotating the wafer W mounted thereon by 180 degrees with respect to the reference direction. Therefore, with the help of this mechanism, the position of the wafer W can be determined when it is in the non-rotated state and also in the 180 degrees rotated state with respect to the reference direction.

Figure 6:
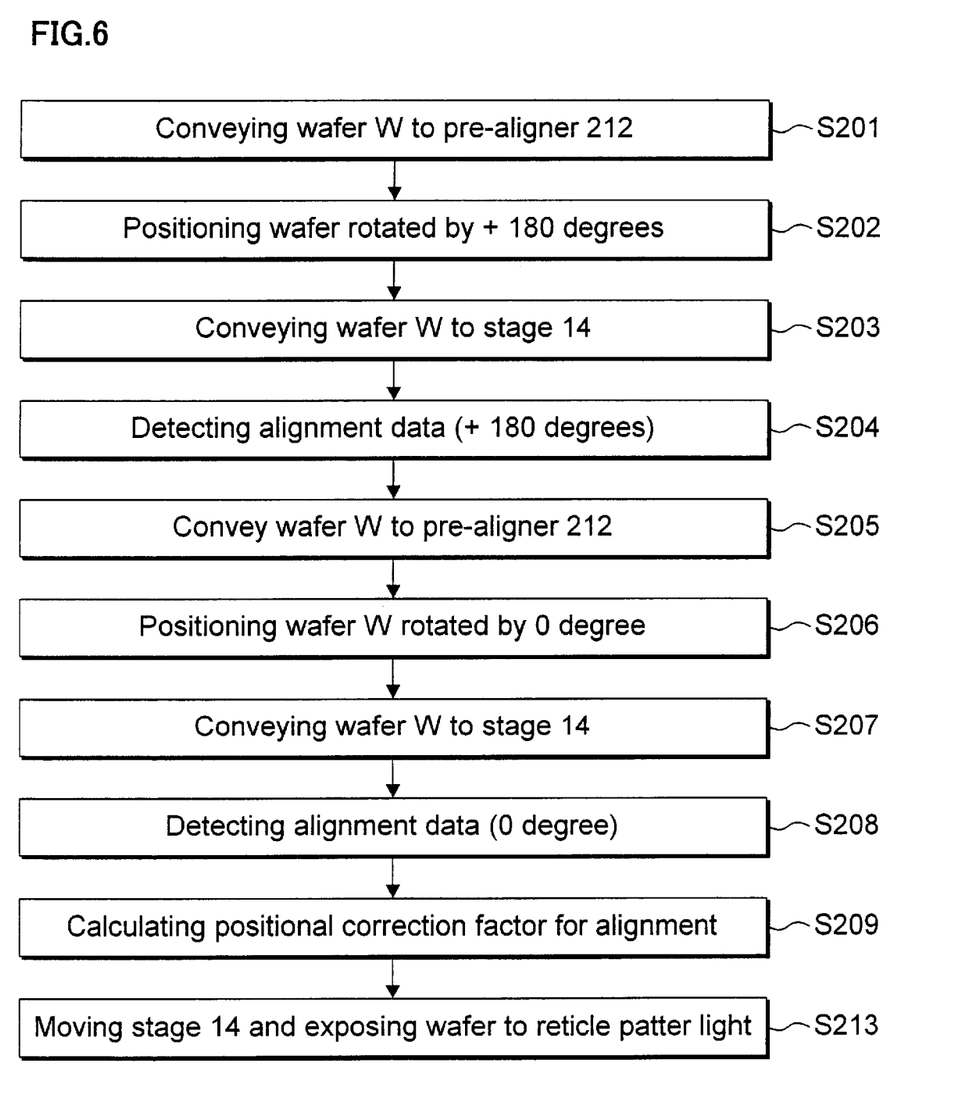
FIG. 6 is a flowchart for explaining an alignment method according the second embodiment of the invention.

The method for aligning the wafer with the reticle pattern according to the second embodiment will now be described with reference to the flowchart of FIG. 6. In the first place, the wafer W is conveyed to and mounted on the pre-aligner 212 (step S201). With the subsequent operation of the rotation mechanism, the wafer W is rotated by 180 degrees with respect to the reference direction (step S202).

Then, the wafer W is conveyed to and mounted on the stage 14 (step S203), where the positional detection is carried out with respect to each of alignment marks 16a and 16b (step S204). This positional detection is carried out in the same manner as is done in the first embodiment as described above. The positional data obtained from these alignment marks of the 180 degrees rotated wafer W by means of this positional detection are temporarily stored in a memory.

After completing the detection of positional data with respect to the alignment marks 16a and 16b of the 180 degrees rotated wafer, the wafer W is again conveyed to and mounted on the pre-aligner 112 (step S205). With the subsequent operation of the rotation mechanism, the wafer W is reverse rotated to return to the 0 degree rotation state, that is, to be directed to the reference direction (step S206). Then, the wafer W is again conveyed to and mounted on the stage 14 (step S207), where the positional detection is again carried out with respect to alignment marks 16a and 16b of the wafer directed to the reference direction (step S208). The positional data obtained from these alignment marks of the wafer W directed to the reference direction are temporarily stored in the memory.

Next, the positional correction factor for the wafer W is calculated by making use of the positional data which are obtained from alignment marks of the 180 degrees rotated wafer W, and those which are obtained from alignment marks of the wafer directed to the reference direction, respectively (step S209). This calculation of the positional correction factor is performed in the same manner as carried out in the first embodiment.

According to the second embodiment, the positional data detection with respect to alignment marks (S208) is carried out in such a state that the wafer W has been already set up in the reference direction, so that it may be possible to eliminate the steps S110 through S112 (first embodiment) for setting up the wafer W such that it directs to the reference direction. Then, the wafer W is again conveyed to and mounted on the stage 14 (step S209), where there are executed the final alignment between the wafer and the reticle pattern, and the exposure of the wafer to the reticle pattern light for copying the reticle pattern to the wafer W (step S213).

As described above, according to the second embodiment of the invention, the positional correction factor can be calculated by using the positional data obtained from the alignment marks on the wafer set up such that it directs to the reference direction, so that after calculating the positional correction factor, there is no need for any step to be carried out for setting up the wafer W such that it directs to the reference direction, such as steps S110 through S112 of the first embodiment. Consequently, the second embodiment of the invention contributes to reduction in the number of steps necessary for aligning the wafer with the reticle pattern.

Third Embodiment

A stage 314 used in this embodiment is provided with a rotation mechanism capable of rotating the wafer W mounted thereon by +90 degrees and −90 degrees with respect to the reference direction. Therefore, with the help of this mechanism, the position of the wafer W can be determined when it is in the +90 degrees rotated state and also in the −90 degrees rotated state with respected to the reference direction.

Figure 7:
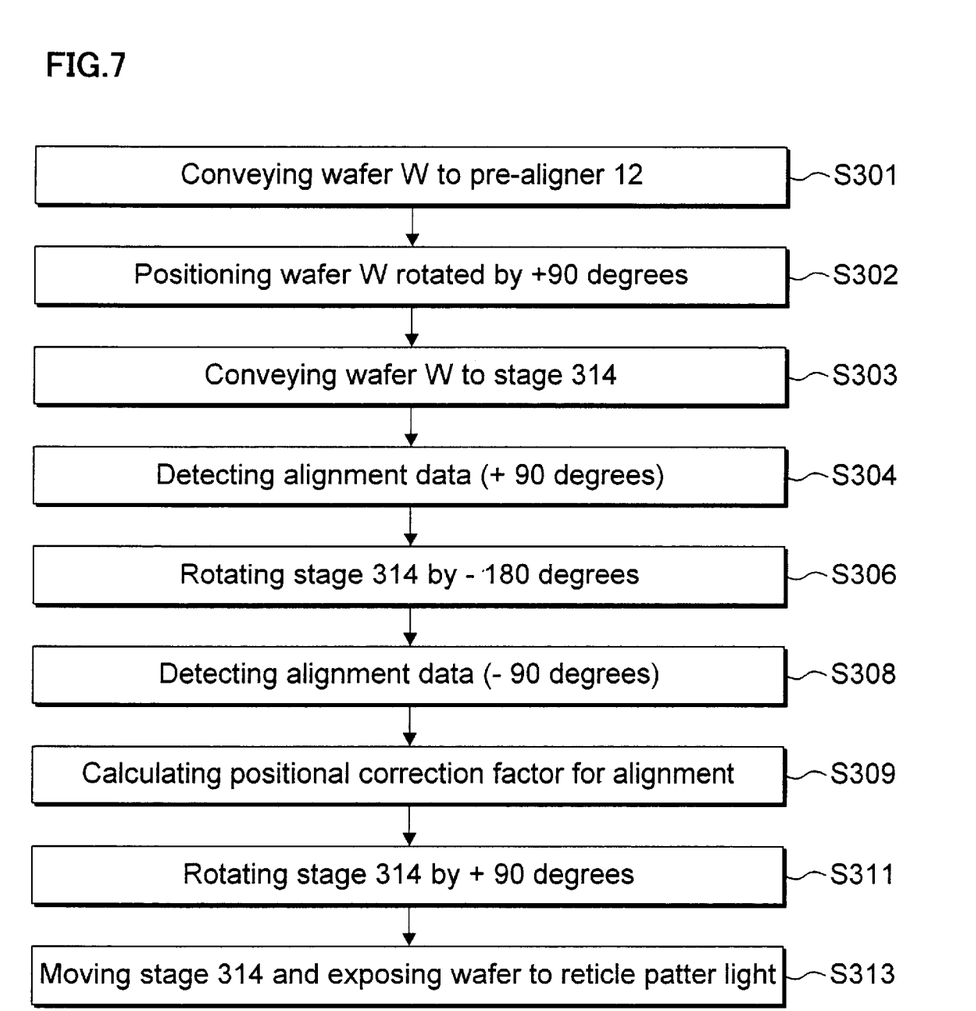
FIG. 7 is a flowchart for explaining an alignment method according the third embodiment of the invention.

The method for aligning the wafer with the reticle pattern according to the third embodiment will now be described with reference to the flowchart of FIG. 7. To start with, the wafer W is conveyed to and mounted on the pre-aligner 12 (step S301). With the subsequent operation of the rotation mechanism of the pre-aligner, the wafer W is rotated by +90 degrees with respect to the reference direction (step S302).

Then, the wafer W is conveyed to and mounted on the stage 314 (step S303), where the positional detection is carried out with respect to each of the alignment marks 16a and 16b (step S304). This positional detection is performed in the same manner as carried out in the first embodiment as described above. The positional data obtained from these alignment marks of the +90 degrees rotated wafer W by means of this positional detection are temporarily stored in the memory.

In the next, the stage 314 is rotated by −180 degrees from its current position, that is, the above +90 degrees rotated position, thereby the wafer W coming to take the position equal to that which is rotated by −90 degrees with respect to the reference direction (step S306). Like this, since the stage 314 is provided with the rotation mechanism capable of rotating the wafer W mounted thereon, there can be eliminated the step of transfer the wafer between the stage and the pre-aligner (correspond to steps S105 and S107 of the first embodiment). Then, the positional detection is carried out with respect to each of alignment marks 16a and 16b (step S308). The positional data obtained from these alignment marks of the −90 degrees rotated wafer W by means of this detection are temporarily stored in the memory.

The positional correction factor for the wafer W is then calculated by making use of the positional data which are obtained from alignment marks of the +90 degrees rotated wafer W and the positional data which are obtained from alignment marks of the −90 degrees rotated wafer, respectively (step S309). This calculation of the positional correction factor is performed in the same manner as carried out in the first embodiment.

Next, the stage 314 is rotated by +90 degrees, thereby the wafer taking the position directing to the reference direction (step S311). According to the third embodiment, since the stage 314 is provided with a rotation mechanism capable of rotating the wafer W mounted thereon, it becomes possible to eliminate some steps (correspond to the steps S110 and S112 in the first embodiment) of transferring the wafer from the pre-aligner to the stage or vice versa. Finally, the alignment between the wafer and the reticle pattern is executed by moving the stage 314 in the necessary directions (X and/or Y), and the exposure of the wafer to the reticle pattern light is carried out to copy the reticle pattern to the wafer W (step S313).

According to the third embodiment as described above, since the stage 314 is provided with the rotation mechanism capable of rotating the wafer W mounted thereon, it possible to eliminate some steps (correspond to the steps S105 and S107 and the steps S110 and S112 of the first embodiment) of transferring the wafer from the pre-aligner to the stage or vice versa. Consequently, the third embodiment of the invention contributes to a reduction in the number of steps necessary for aligning the wafer with the reticle pattern.

Fourth Embodiment

A stage 414 used in this embodiment is provided with a rotation mechanism capable of rotating the wafer W mounted thereon by 180 degrees with respect to the reference direction. Therefore, with the help of this mechanism, the position of the wafer W can be determined when it is in the non-rotated state (0 degree rotated state) and also in the 180 degrees rotated state with respect to the reference direction.

Figure 8:
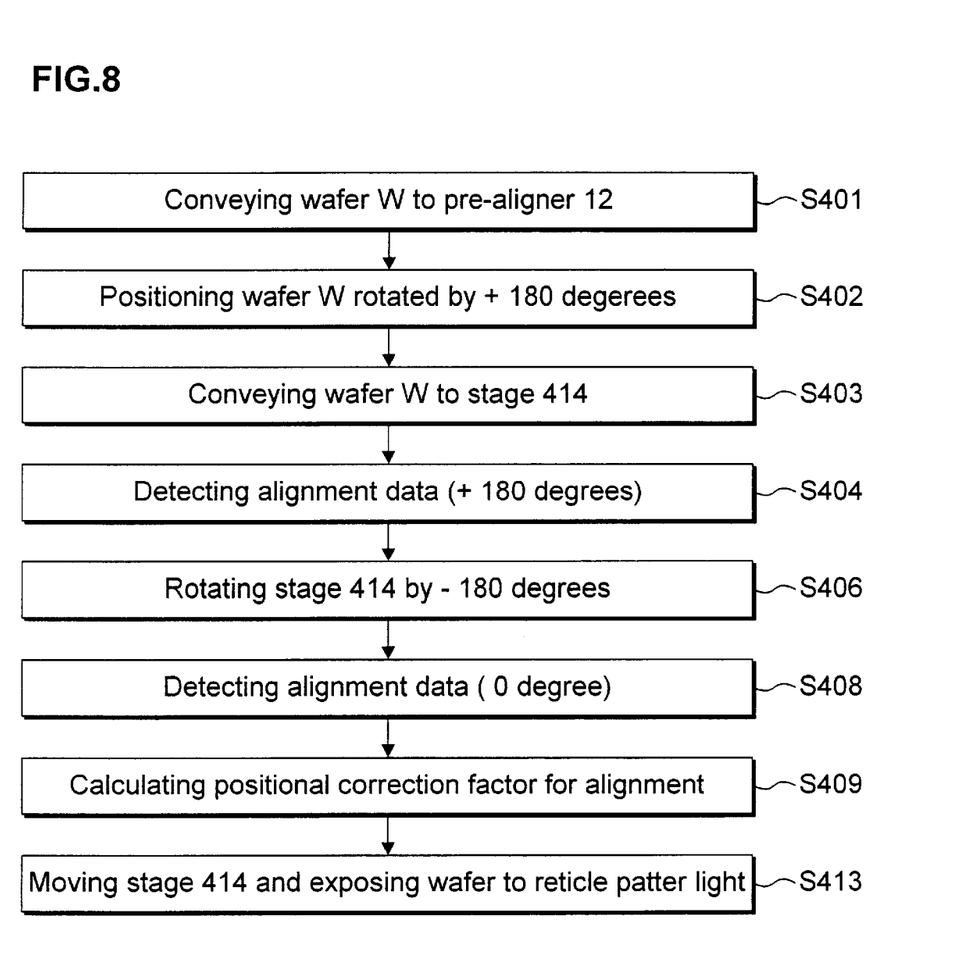
FIG. 8 is a flowchart for explaining an alignment method according the fourth embodiment of the invention.

The method for aligning the wafer with the reticle pattern according to the fourth embodiment will now be described with reference to the flowchart shown in FIG. 8. In the first place, the wafer W is conveyed to and mounted on the pre-aligner 12 (step S401). With the subsequent operation of the rotation mechanism of the pre-aligner, the wafer W is rotated by 180 degrees with respect to the reference direction (step S402).

Then, the wafer W is conveyed to and mounted on the stage 414 (step S403), where the positional detection is carried out with respect to each of alignment marks 16a and 16b (step S404). This positional detection is performed in the same manner as carried out in the first embodiment as described above. The positional data obtained from these alignment marks of the 180 degrees rotated wafer W by means of this positional detection are temporarily stored in a memory.

Next, the rotation mechanism of the stage 414 operates to rotate the wafer by −180 degrees, and thereby the wafer W is directed to the reference direction (step S406). In this way, since the stage 414 is provided with a rotation mechanism capable of rotating the wafer W mounted thereon, the step of transferring the wafer from the stage to the pre-aligner or vice versa (correspond to steps S105 and S107 in the first embodiment) can be eliminated. Then, the positional detection is carried out with respect to each of alignment marks 16a and 16b (step S408). The positional data obtained from these alignment marks of the wafer W directing to the reference direction are temporarily stored in a memory.

The positional correction factor for the wafer W is then calculated by making use of the positional data which are obtained from the alignment marks of the 180 degrees rotated wafer W and the positional data which are obtained from the alignment marks of the wafer directing to the reference direction (step S409). This calculation of the positional correction factor is carried out in the same manner as in the first embodiment.

According to the fourth embodiment, the positional data detection with respect to the alignment marks (step S408) is carried out in such a state that the wafer W has been already set up in the reference direction, so that it may be possible to further eliminate the steps of setting up the wafer W in the reference direction (correspond to step S311 of the third embodiment). Then, the final alignment between the wafer and the reticle pattern is carried out by moving the stage 414 in the necessary directions (X and/or Y), and the exposure of the wafer to the reticle pattern light is executed to copy the reticle pattern to the wafer W (step S413).

According to the fourth embodiment as described above, since the stage 414 is provided with a rotation mechanism capable of rotating the wafer W mounted thereon, it possible to eliminate some steps of transferring the wafer from the pre-aligner 12 to the stage 414 or vice versa (correspond to the steps S105 and S107 and the steps S110 and 112 in the first embodiment). Consequently, the fourth embodiment of the invention contributes to a reduction in the number of steps necessary for aligning the wafer with the reticle pattern.

Furthermore, the positional data with respect to alignment marks of the wafer directed to the reference direction can be used for the calculation of the positional correction factor for the wafer. Therefore, after the step of calculating the positional correction factor (step S409), it is not necessary to set up the wafer so that it is directed to the reference direction, such as steps S110 through S112 or step S311. Thus, the fourth embodiment of the invention contributes to a reduction in the number of steps necessary for aligning the wafer with the reticle pattern.

While preferred embodiments of the invention have been shown and described in connection to the method and system for aligning the object to be processed with the target article, the invention is not limited to these embodiments as such. It will be apparent to those skilled in the art that changes and modifications can be made within the technical thoughts recited in the scope of claims for patent as appended hereto. Accordingly, the foregoing embodiments are to be considered illustrative, rather than restricting the invention, and those modifications and changes which come within the meaning and range of equivalency of the claims are to be included therein.

For instance, in the above description of preferred embodiments according to the invention, various discussions have been made mainly in connection with the method for aligning the wafer with the reticle pattern, but the invention is not limited thereto. The invention is applicable to any process in which an object to be processed is required to be most suitably aligned with a predetermined target article.

Furthermore, the alignment optical system has been described such that it makes use of the TTL system or the Off-axis system in order to detect the positional data, but it should not be limited thereto. Any other optical system can be made use of.

As has been discussed, according to the invention, the alignment accuracy can be enhanced by correcting the difference in the reflected waveform of the alignment light generated by the alignment optical system.

The entire disclosure of Japanese Patent Application No. 11-233708 filed on Aug. 20, 1999 including specification, claims, drawings and summary is incorporated herein by reference in its entirety.

What is claimed is:

1. A method for aligning an object to be processed with a predetermined target article, said method being executed by a system which includes a pre-aligner for preliminarily positioning said object before conveying it into a processing area, and a stage for supporting said object from the underside thereof, said method comprising the following processes:

a first process for conveying said object to said pre-aligner to mount it thereon, operating said pre-aligner to rotate said object in a first direction by a predetermined number of degrees with respect to a reference direction, and positioning said object in such a rotated state;

a second process for conveying said object to said stage to mount it thereon and detecting positional data with respect to said object in such rotated state;

a third process for again conveying said object to said pre-aligner to mount it thereon, operating said pre-aligner to rotate said object in a second direction by approximately said predetermined number of degrees with respect to the reference direction, said second direction being opposite said first direction, and positioning said object in such a rotated state;

a fourth process for again conveying said object to said stage to mount it thereon and detecting further positional data with respect to said object in such a rotated state;

a fifth process for calculating a positional correction factor for said object by making use of the positional data detected in the second and fourth processes; and a sixth process for finally conveying said object to said pre-aligner to mount it thereon, and operating said pre-aligner to rotate said object so that said object is directed in the reference direction.

2. A method as claimed in claim 1, wherein said object is a semiconductor wafer.

3. A method as claimed in claim 1, wherein said system further includes a stepping projection aligner.

4. A method as claimed in claim 1, wherein the detection of said positional data during said second and fourth processes is carried out using a Through-The-Lens (TTL) system.

5. A method as claimed in claim 1, wherein the detection of said positional data during said second and fourth processes is carried out using an Off-axis system.

6. A method as claimed in claim 1, wherein said predetermined number of degrees is approximately 90 degrees.

7. A method for aligning an object to be processed with a predetermined target article, said method being executed by a system which includes a pre-aligner for positioning said object before conveying it into a processing area, and a stage for supporting said object from the underside thereof, said method comprising the following processes:

a first process for conveying said object to said pre-aligner to mount it thereon, operating said pre-aligner to rotate said object by a predetermined number of degrees with respect to a reference direction, and positioning said object in such a rotated state;

a second process for conveying said object to said stage to mount it thereon and detecting positional data with respect to said object in such rotated state;

a third process for again conveying said object to said pre-aligner to mount it thereon, operating said pre-aligner to rotate said object such that said object is directed toward the reference direction, and positioning said object in such rotated state;

a fourth process for again conveying said object to said stage to mount it thereon and detecting further positional data with respect to said object directed toward the reference direction; and a fifth process for calculating a positional correction factor for said object by making use of the positional data detected in the second and fourth processes.

8. A method as claimed in claim 7, wherein said object is a semiconductor wafer.

9. A method as claimed in claim 7, wherein said system further includes a stepping projection aligner.

10. A method as claimed in claim 7, wherein the detection of said positional data during said second and fourth processes is carried out using a Through-The-Lens (TTL) system.

11. A method as claimed in claim 7, wherein the detection of said positional data during said second and fourth processes is carried out using an Off-axis system.

12. A method as claimed in claim 7, wherein said predetermined number of degrees is approximately 180 degrees.

13. A method for aligning an object to be processed with a predetermined target article, said method being executed by a system which includes a pre-aligner for positioning said object before conveying it into a processing area, and a stage for supporting said object from the underside thereof, said method comprising the following processes:

a first process for conveying said object to said pre-aligner to mount it thereon, operating said pre-aligner to rotate said object in a first direction by a predetermined number of degrees with respect to a reference direction, and positioning said object in such a rotated state;

a second process for conveying said object to said stage to mount it thereon and detecting positional data with respect to said object in such rotated state;

a third process for operating said stage to rotate said object mounted thereon in a second direction that is opposite said first direction by approximately twice said predetermined number of degrees, to an orientation such that said object is substantially rotated in said second direction by said predetermined number of degrees with respect to the reference direction, and then detecting further positional data with respect to said object;

a fourth process for calculating a positional correction factor for said object by making use of the position data detected in the second and third processes; and a fifth process for again rotating said stage in said first direction by approximately said predetermined number of degrees to direct said object to the reference direction.

14. A method as claimed in claim 13, wherein said object is a semiconductor wafer.

15. A method as claimed in claim 13, wherein said system further includes a stepping projection aligner.

16. A method as claimed in claim 13, wherein the detection of said positional data during said second and third processes is carried out using a Through-The-Lens (TTL) system.

17. A method as claimed in claim 13, wherein the detection of said positional data during said second and third processes is carried out using an Off-axis system.

18. A method as claimed in claim 13, wherein said predetermined number of degrees is approximately 90 degrees.

19. A method for aligning an object to be processed with a predetermined target article, said method being executed by a system which includes a pre-aligner for positioning said object before conveying it into a processing area, and a stage for supporting said object from the underside thereof, said method comprising the following processes:

- a first process for conveying said object to said pre-aligner to mount it thereon, operating said pre-aligner to rotate said object by a predetermined number of degrees with respect to a reference direction, and positioning said object in such a rotated state;
- a second process for conveying said object to said stage to mount it thereon and then detecting positional data with respect to said object in such rotated state;
- a third process for operating said stage to rotate said object mounted thereon again by approximately said predetermined number of degrees, so that said object is substantially oriented in the reference direction, and then detecting further positional data of said object; and
- a fourth process for calculating a positional correction factor for said object using the positional data detected in the second and third processes.

20. A method as claimed in claim 19, wherein said object is a semiconductor wafer.

21. A method as claimed in claim 19, wherein said system further includes a stepping projection aligner.

22. A method as claimed in claim 19, wherein the detection of said positional data during said second and third processes is carried out using a Through-The-Lens (TTL) system.

23. A method as claimed in claim 19, wherein the detection of said positional data during said second and third processes is carried out using an Off-axis system.

24. A method as claimed in claim 19, wherein said predetermined angle is approximately 180 degrees.

25. A method as claimed in claim 19, wherein said object is rotated in a first direction during said first process and in a second direction during said third process, said second direction being opposite said first direction.

* * * * *